United States Patent
Hause et al.

(10) Patent No.: US 6,410,967 B1
(45) Date of Patent: Jun. 25, 2002

(54) TRANSISTOR HAVING ENHANCED METAL SILICIDE AND A SELF-ALIGNED GATE ELECTRODE

(75) Inventors: Frederick N. Hause, Austin; Mark I. Gardner, Cedar Creek; Charles E. May, Austin, all of TX (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/173,273

(22) Filed: Oct. 15, 1998

(51) Int. Cl.⁷ ................................................ H01L 29/72
(52) U.S. Cl. .................... 257/377; 257/382; 257/384; 257/396; 257/408; 257/412; 257/413
(58) Field of Search ................................. 257/396, 377, 257/382, 412, 413, 384, 408

(56) References Cited

U.S. PATENT DOCUMENTS

| | | | |
|---|---|---|---|
| 4,109,371 A | | 8/1978 | Shibata et al. |
| 4,683,645 A | * | 8/1987 | Naguib et al. ............... 257/433 |
| 4,716,131 A | * | 12/1987 | Okazawa et al. ........... 257/412 |
| 4,731,339 A | | 3/1988 | Ryan et al. |
| 4,992,387 A | | 2/1991 | Tamura |
| 5,252,502 A | | 10/1993 | Havemann |
| 5,268,590 A | | 12/1993 | Pfiester et al. |
| 5,445,977 A | | 8/1995 | Fujimoto |
| 5,576,227 A | | 11/1996 | Hsu |
| 5,583,067 A | | 12/1996 | Sanchez |
| 5,646,435 A | | 7/1997 | Hsu et al. |
| 5,654,570 A | | 8/1997 | Agnello |
| 5,717,254 A | | 2/1998 | Hashimoto |
| 5,821,594 A | | 10/1998 | Kasai |
| 5,834,811 A | * | 11/1998 | Huang ......................... 257/432 |
| 5,918,130 A | | 6/1999 | Hause et al. |
| 5,959,337 A | | 9/1999 | Gardner et al. |
| 6,084,280 A | | 7/2000 | Gardner et al. |

FOREIGN PATENT DOCUMENTS

| | | |
|---|---|---|
| DE | 1923279 | 12/1970 |
| EP | 0 614 226 | 9/1994 |
| JP | 359034665 | 2/1984 |
| JP | 59-215774 | 12/1984 |
| JP | 360195978 | 10/1985 |

OTHER PUBLICATIONS

Wolf, et al, "Silicon Processing For The VLSI Era, Voulme 1: Process Technology," Lattice Press, Snset Beach, California, 1986, pp. 384–406; and pp. 516–518.

Wolf, "Silicon Processing For The VLSI Era, Voulme 2; Process Technology," Lattice Press, Snset Beach, California, 1990, pp. 143–152.

* cited by examiner

Primary Examiner—Edward Wojciechowicz
(74) Attorney, Agent, or Firm—Conley, Rose & Tayon, PC; Robert C. Kowert

(57) ABSTRACT

A transistor and a method for making a transistor are described. A metal layer is formed upon a semiconductor substrate, and a masking layer is formed upon the metal layer. The masking layer is patterned to form an opening therein, and portions of the metal layer not covered by the masking layer are removed. A gate dielectric layer is formed within the opening upon the semiconductor substrate; in an embodiment, spacers are also formed upon opposed sidewall surfaces of the masking layer. A conductive material is then deposited upon the dielectric material to form a gate conductor. The masking material is then removed, source and drain and lightly doped drain impurity areas are formed in the semiconductor substrate, and the metal layer is annealed to form a silicide in close proximity to the channel region. By depositing the metal layer prior to forming the gate conductor, the process described herein allows formation of a metal silicide adjacent or in close proximity to the channel region of the transistor. The process also allows formation of a metal gate conductor self-aligned with lightly doped drain or source-drain impurity areas.

14 Claims, 8 Drawing Sheets

TRANSISTOR HAVING ENHANCED METAL SILICIDE AND A SELF-ALIGNED GATE ELECTRODE

BACKGROUND OF THE INVENTION

1. Field of the Invention

This invention relates to integrated circuit fabrication and, more particularly, to fabricating a transistor having a metal silicide formed in close proximity to the gate. This invention also relates to fabricating a transistor having a metal gate electrode.

2. Description of the Related Art

Early MOS integrated circuits were developed using aluminum gate electrodes. These early MOS transistors, however, had several disadvantages. For example, because the earliest MOS circuits utilized p-channel devices, they required a power supply of −12 V for the drain supply. They were also very slow, about an order of magnitude slower than bipolar devices. Although the use of n-channel devices could have provided significantly improved performance, only depletion-mode NMOS devices could be reliably manufactured, whereas enhancement-mode NMOS devices are required for most applications.

In addition, aluminum must be deposited following completion of all high-temperature processing steps, including implantation and subsequent anneal of the source and drain regions. This requires separately aligning the aluminum gate electrode to the source and the drain. If the gate does not fully extend between the source and drain regions, the device will not operate. As such, aluminum gates were formed with some degree of overlap of the source and the drain to allow for variability in lateral diffusion of the source and drain and for possible misalignment of the gate during fabrication. Overlap of the gate with the source and drain regions, however, can be a particularly troublesome source of stray capacitance. Parasitic capacitances associated with MOS devices can limit the high-frequency operation of MOS transistors.

One of the key process innovations for MOS integrated circuit fabrication was the replacement of aluminum with heavily doped polycrystalline silicon ("polysilicon") as the gate electrode. Because polysilicon, like the silicon substrate upon which integrated circuits are typically formed, has a high melting point, the gate electrode may be formed prior to the source and drain regions. Subsequent high-temperature anneals may then be used to drive in the source and drain implants and repair damage to the substrate without adversely affecting the gate. Forming the source and drain regions self-aligned with the gate also decreases overlap, and thus parasitic capacitance. The self-aligned process also advantageously allows for increased packing density of transistors upon the substrate and simplifies the fabrication procedure.

The use of polysilicon as the gate conductor is not, however, without its own disadvantages. Because polysilicon is a semiconductive or insulative material, it must be doped with conductive impurities to decrease its resistivity. However, even when doped at the highest practical concentrations, polysilicon has a sheet resistance about 400 times higher than the sheet resistance of an aluminum layer of comparable thickness. Further, polysilicon gate electrodes are subject to the so-called "poly depletion effect." That is, dopants implanted into the polysilicon gate to render it conductive do not penetrate completely to the interface between the polysilicon and the underlying gate conductor. The magnitude of the poly depletion effect can vary, but in general at least 3–10% of the polysilicon remains undoped. As a result, the undoped portion of the gate electrode acts as an insulator, increasing the effective thickness of the gate dielectric and thus the threshold voltage.

High resistance values in polysilicon interconnect lines can lead to long propagation delays and severe variations in DC voltages within an integrated circuit. The formation of metal silicide layers on top of the doped polysilicon ("polycide" layers) was developed to at least partially overcome this disadvantage. Polycide layers have resistivities on the order of 20 times lower than the resistivity of polysilicon. Further, silicide layers may be formed upon the upper surfaces of the source and drain areas in order to minimize the contact resistance in submicron MOSFETs.

Contact holes or vias may be formed in an interlevel dielectric covering a semiconductor topography to expose a portion of the upper surface of the silicon substrate. The surface of the substrate may be cleaned to remove the thin native oxide layer that forms on silicon surfaces exposed to oxygen-containing ambients. A metal film may then be deposited within the contact holes upon the exposed upper surfaces of the source and drain regions of the silicon substrate. A thermal anneal may be used to cause reaction between the metal and the silicon to form the corresponding metal silicide at the contact. The silicide contact regions are, however, spaced from the gate by at least several hundred angstroms. Thus, although the contact between the metal and the substrate exhibits lowered resistivity due to the presence of the silicide, the spacing of the silicide contact region from the channel contributes to increased resistance, and thus decreased transistor speed, due to the increased conductive path length through the higher-resistivity source and drain regions.

It would therefore be desirable to fabricate a transistor having a gate that combined the low resistivity of metals with the alignment properties of polysilicon. It would further be desirable to fabricate a transistor having metal suicides formed in close proximity to the gate to decrease the resistivity associated with the source-to-drain conductive pathway.

SUMMARY OF THE INVENTION

The problems outlined above may be solved by the technique hereof for forming a transistor having a metal gate electrode and silicide regions formed in close proximity to the gate. According to the process of the present application, the upper surface of a silicon semiconductor substrate may be cleaned using, for example, the well-known RCA method. The RCA method is described in S. Wolf and R. N. Tauber, *Silicon Processing for the VLSI Era, Vol 1—Process Technology*, pp. 516–518 (Lattice Press, Sunset Beach, Calif.; 1986), which is incorporated herein by reference. A layer of metal is then deposited across the semiconductor substrate. Preferably, the metal is cobalt. Alternatively, the metal may be, e.g., titanium or nickel.

A layer of masking material is deposited across the metal and selectively patterned and etched to form masking structures. The masking material may be a dielectric material, such as silicon dioxide or silicon nitride or a combination thereof or any other suitable masking material(s). In one embodiment, the masking material may be photoresist. Following etching of the masking material, portions of the metal layer not covered by the masking structures are removed from upon the semiconductor substrate. If the masking structures include a dielectric material such as silicon dioxide, either a wet etch or a dry plasma) etch may be used. If the masking structures include photoresist, a plasma etch is preferred to avoid lifting of the photoresist.

In an embodiment, a conformal dielectric material may be deposited across the masking structures and the exposed upper surface of the semiconductor substrate. The dielectric may be, e.g., silicon dioxide ("oxide"), silicon nitride ("nitride"), or silicon oxynitride ("oxynitride"). The dielectric material is preferably deposited to a thickness of less than about 50 angstroms and preferably between about 15 angstroms and about 25 angstroms. In an embodiment, the dielectric layer may be of substantially similar thickness adjacent sidewall surfaces of the masking structures and adjacent the upper surface of the silicon substrate. In an alternative embodiment, the thickness of the dielectric layer may vary such that, e.g., the dielectric layer is thicker adjacent the substrate upper surface than adjacent the sidewall surfaces.

A layer of conductive material may then be deposited upon the dielectric layer. Preferably, the conductive material may be a second metal layer and may include a refractory metal such as tungsten. Alternatively, the conductive material may be doped polysilicon. Following deposition of the conductive material layer, portions of the conductive material and the dielectric layer may be removed to an elevational level commensurate with the upper surface of the masking structures using, e.g., a chemical-mechanical polish. The masking structure may then be removed to leave a gate structure upon the semiconductor substrate upper surface. In an embodiment in which the masking structure may be selectively etched with respect to the dielectric material, the gate structure may include a gate conductor spaced above the semiconductor substrate by a dielectric. The dielectric may include a gate dielectric formed upon the semiconductor substrate and vertical portions extending from the gate dielectric adjacent sidewall surfaces of the gate conductor. Source and drain ("S/D") impurity areas may be formed using, e.g., a high-dose, high-energy ion implant into the semiconductor substrate. Lightly doped drain ("LDD") areas may be simultaneously formed beneath the vertical dielectric portions.

Alternatively, spacers may be formed adjacent the vertical dielectric portions to extend the lightly doped drain areas and to space the source and drain areas farther from the channel region. The LDD areas may be formed simultaneously with the SID areas following spacer formation. Alternatively, the LDD areas may be formed prior to the spacers, and the S/D areas formed after the spacers. In a further alternative, the spacers may be formed first, followed by formation of the S/D areas. The spacers may then be removed and the LDD areas formed.

After the S/D areas and LDD areas have been formed, the semiconductor topography may be annealed to activate the doped areas and to form a metal silicide from the metal layer and the underlying silicon substrate. The metal silicide layer formed according to the process described herein may be separated from the channel region by only the width of the thin spacers (e.g., about 50 angstroms or less). The additional spacers are formed above the silicide and as such do not separate the silicide from the channel region.

In an alternative embodiment, the vertical dielectric portions and the masking structures may be removed simultaneously (e.g., in an embodiment where both the conformal dielectric material and the masking material include oxide). According to this embodiment, spacers must be formed adjacent the gate to allow formation of LDD areas. In an embodiment, the spacers may be formed first and the LDD and S/D areas may be formed simultaneously using, e.g., a single high-dose, high-energy implant. Alternatively, the LDD areas may be formed first, followed by formation of the spacers and the S/D areas. In a further alternative, the spacers may be formed first, followed by S/D area formation, removal of the spacers, and formation of the LDD areas. Most any LDD process may be employed, including asymmetrical and multi-graded LDD processes. Note also that LDD formation is optional. Following formation of the LDD and S/D areas, the semiconductor topography may be annealed to form the metal silicide above the junction regions.

According to another alternative embodiment, the gate dielectric is grown rather than deposited following formation of the masking structures and selective removal of the metal layer. The conductive material layer is then deposited upon the gate dielectric. According to this embodiment, the masking structures are then removed and spacers are formed adjacent the gate to allow formation of LDD areas. In an embodiment, the spacers may be formed first and the LDD and S/D areas may be formed simultaneously using, e.g., a single high-dose, high-energy implant. Alternatively, the LDD areas may be formed first, followed by formation of the spacers and the S/D areas. In a further alternative, the spacers may be formed first, followed by S/D area formation, removal of the spacers, and formation of the LDD areas. Or other LDD processes may be employed. Note also that LDD formation is optional. Following formation of the LDD and S/D areas, the semiconductor topography may be annealed to form the metal suicide above the junction regions. To prevent contact between the silicide-forming metal layer and the conductive material, additional dielectric spacers may be formed adjacent the masking structures prior to conductive material deposition.

BRIEF DESCRIPTION OF THE DRAWINGS

Other objects and advantages of the invention will become apparent upon reading the following detailed description and upon reference to the accompanying drawings in which.

Figure 1:
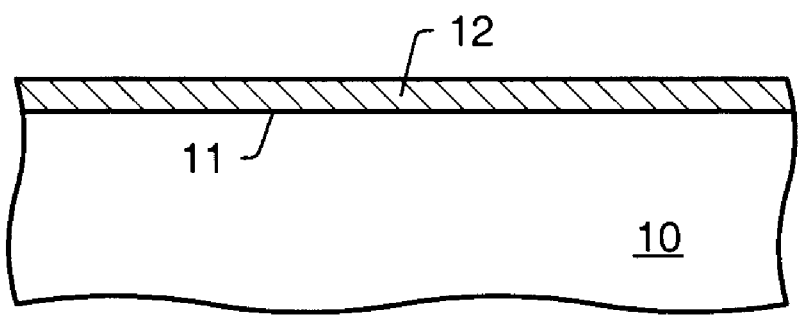
FIG. 1 depicts a partial cross-sectional view of a semiconductor topography according to an embodiment of the present invention, wherein a metal layer is formed upon a semiconductor substrate.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF THE INVENTION

Turning now to the drawings, FIG. 1 depicts a semiconductor substrate 10 on which a layer of metal 12 has been deposited. Semiconductor substrate 10 may be single crystalline silicon. In an embodiment, metal layer 12 may include cobalt deposited to a thickness of between about 100 angstroms and about 300 angstroms. Alternatively, metal layer 12 may include any metal capable of forming a silicide, such as nickel or titanium. Metal layer 12 may be deposited using, e.g., sputter deposition or chemical vapor deposition (such as metal organic chemical vapor deposition). Preferably, upper surface 11 of semiconductor substrate 10 is cleaned prior to deposition of metal layer 12 using, for example, the RCA method.

Figure 2:
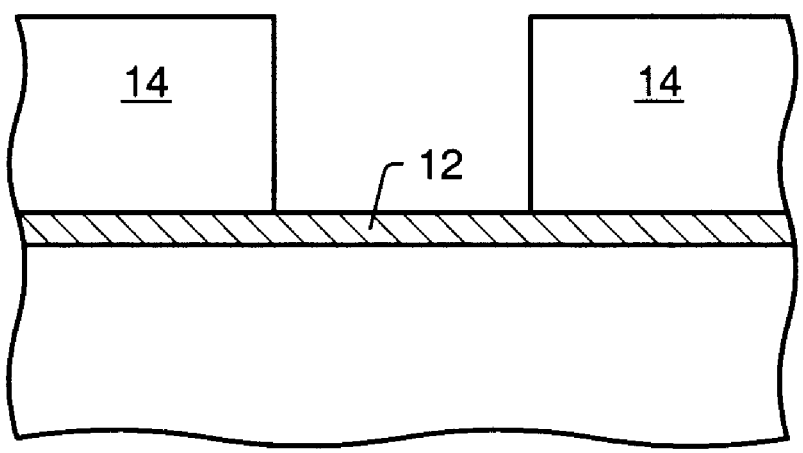
FIG. 2 depicts a partial cross-sectional view of the semiconductor topography wherein masking structures are formed upon the metal layer.

Following deposition of metal layer 12, a layer of masking material may be formed upon the metal layer. The masking material is preferably formed to a thickness of between about 800 angstroms and about 2000 angstroms. The masking material may be electively patterned and etched to form masking structures 14, as shown in FIG. 2. In an embodiment in which masking structures 14 include a dielectric material such as silicon dioxide ("oxide"), a layer of photoresist may be deposited upon the masking material. The photoresist may then be patterned by exposure to ultraviolet light and selectively removed, as is well known in the art. Portions of the oxide not masked by the photoresist may then be removed using a plasma etch selective for the oxide. In an alternative embodiment, the masking material may include photoresist. The photoresist may be patterned and selectively removed as is well known in the art to form masking structures 14.

Figure 3:
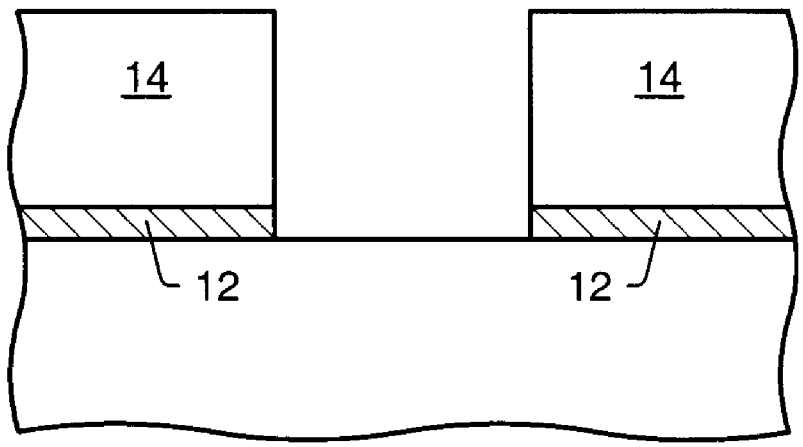
FIG. 3 depicts a partial cross-sectional view of the semiconductor topography wherein portions of the metal layer not covered by the masking structures are removed from upon the semiconductor substrate.

Following formation of masking structures 14, exposed portions of metal layer 12 may be selectively removed, as is shown in FIG. 3. In an embodiment in which masking structures 14 include silicon dioxide, exposed portions of metal layer 12 may be removed using a wet etch. Alternatively, a plasma etch selective for the metal may be used to remove exposed portions of metal layer 12. In an alternative embodiment in which masking structures 14 include photoresist, a plasma etch may be used to remove exposed portions of metal layer 12 to avoid lifting of the photoresist.

Figure 4:
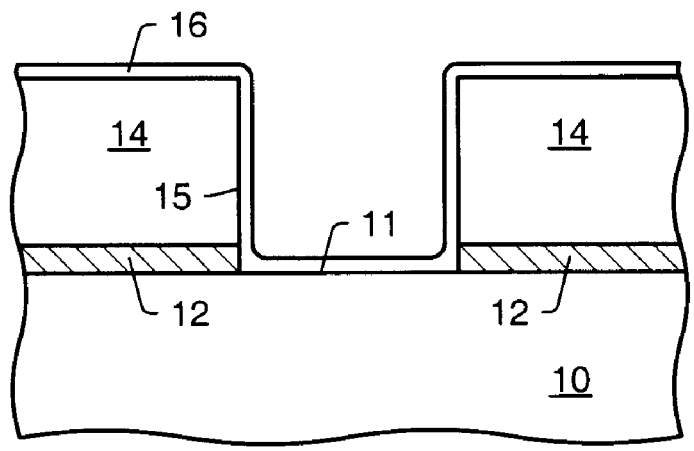
FIG. 4 depicts a partial cross-sectional view of the semiconductor topography wherein a dielectric layer is deposited across the masking structures and exposed portions of the semiconductor substrate.

Turning now to FIG. 4, a gate dielectric material 16 may be deposited across masking structures 14 and the exposed upper surface 11 of semiconductor 10. Gate dielectric material 16 is preferably a conformal dielectric and may include any dielectric material, such as silicon dioxide, silicon nitride ("nitride"), or silicon oxynitride ("oxynitride"). Preferably, gate dielectric material 16 is deposited to a thickness of less than about 50 angstroms and preferably about 15–25 angstroms. In an embodiment, a thickness of gate dielectric material 16 may be substantially similar in portions deposited adjacent vertical surfaces, such as the sidewalls 15 of masking structures 14, and in portions deposited on horizontal surfaces such as upper surface 11 of semiconductor substrate 10. Alternatively, a thickness of gate dielectric material 16 may differ in different portions of the dielectric material, such that, e.g., portions deposited on upper surface 11 are substantially thicker than portions deposited upon sidewalls 15.

Figure 5:
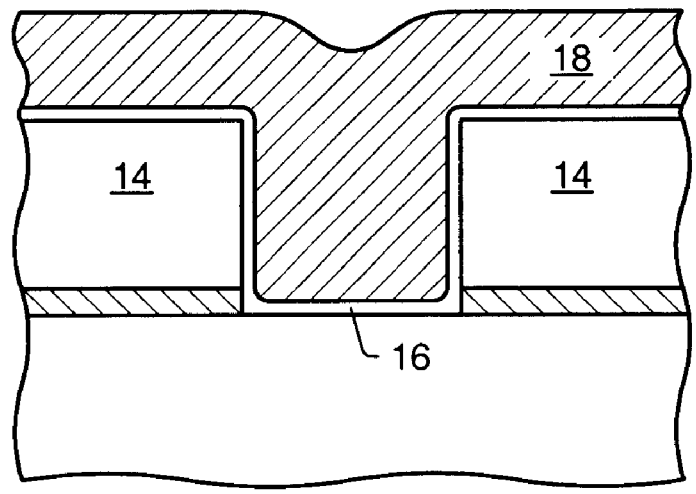
FIG. 5 depicts a partial cross-sectional view of the semiconductor topography wherein a conductive material is deposited upon the dielectric layer.
Figure 6:
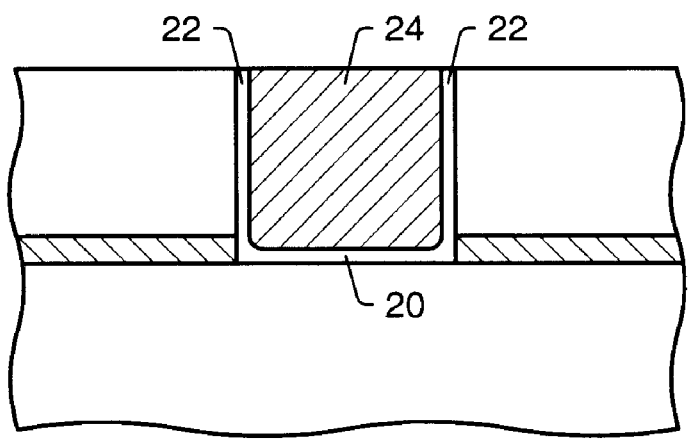
FIG. 6 depicts a partial cross-sectional view of the semiconductor topography wherein the conductive material and the dielectric layer are planarized commensurate with an upper surface of the masking structures.
Figure 7:
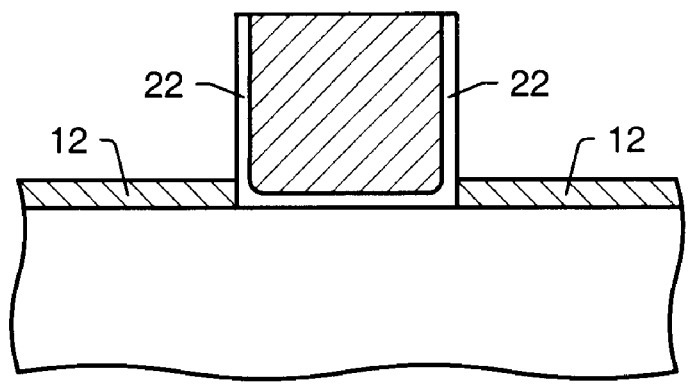
FIG. 7 depicts a partial cross-sectional view of the semiconductor topography wherein the masking structures are removed.

Following deposition of gate dielectric material 16, a conductive material 18 may be deposited upon the dielectric layer, as shown in FIG. 5. Conductive material 18 may be a metal that is, e.g., sputter deposited or chemical-vapor deposited. In an embodiment, the metal may include tungsten. Alternatively, the metal may include a metal such as cobalt or titanium, or a metal compound such as titanium nitride. In a further alternative embodiment, conductive material 18 may include doped polysilicon rather than a metal. Conductive material 18 is preferably deposited to a thickness such that an upper surface of the conductive material is above upper surfaces of the masking structures 14. Portions of conductive material 18 and gate dielectric material 16 may then be removed using, e.g., chemical-mechanical polish. Preferably, conductive material 18 and gate dielectric material 16 are removed at least to a level commensurate with upper surfaces of masking structures 14. The remaining conductive material forms gate conductor 24, as shown in FIG. 6. Portions of the gate dielectric material retained upon upper surface 11 of semiconductor substrate 10 form gate dielectric 20, and portions of the gate dielectric material retained adjacent sidewall surfaces of gate conductor 24 form vertically extending portions 22.

Figure 8:
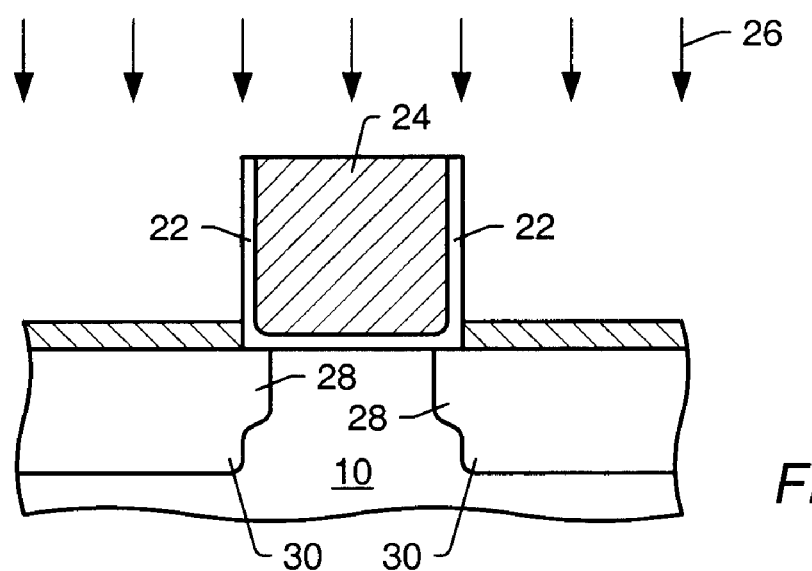
FIG. 8 depicts a partial cross-sectional view of the semiconductor topography wherein source and drain areas and lightly doped drain areas are formed within the semiconductor substrate.

FIGS. 7–10 depict further processing according to an embodiment of the process described herein in which masking structures 14 include a material that may be selectively etched with respect to vertically extending dielectric portions 22 formed adjacent sidewall surfaces of the masking structures. According to this embodiment, masking structures 14 may be selectively removed from upon metal layer 12 without removing vertically extending portions 22 using, e.g., a wet etch selective for the masking material, as shown in FIG. 6. For example, if masking structures 14 include oxide, dielectric portions 22 may include nitride or oxynitride. If dielectric portions 22 include oxide, masking structures 14 may include photoresist. Dopants 26 may then be introduced into semiconductor substrate 10 using, e.g., ion implantation, as shown in FIG. 8. Dopant ions 26 may be implanted at a sufficient concentration and energy to form source and drain ("S/D") impurity areas 30 in regions of substrate 10 not masked by dielectric portions 22 or gate conductor 24. Lightly doped drain ("LDD") impurity areas 28 may be formed in the substrate in regions underlying dielectric portions 22. For example, dopant ions 26 may be implanted at a concentration of between about $2.0 \times 10^{15}$ $cm^{-2}$ and about $9.0 \times 10^{15}$ $cm^{-2}$ and an energy of between about 0.5 keV and about 5.0 keV. In an embodiment, the implant may be performed essentially perpendicular to the substrate surface. In an alternative embodiment, the implant may be performed at an angle of between about 30° and about 60°, and preferably about 45°, with respect to the substrate surface, in order to align the LDD implant more closely with the gate.

Figure 9:
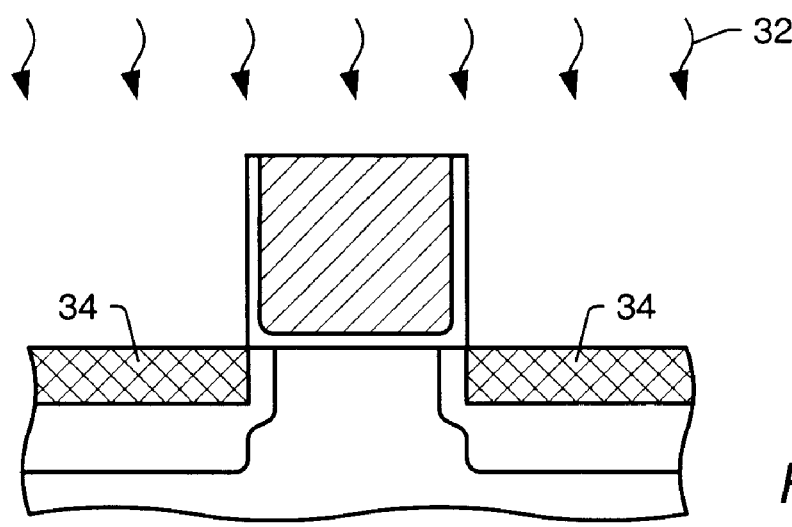
FIG. 9 depicts a partial cross-sectional view of the semiconductor topography wherein an anneal is performed to form a metal silicide upon the source and drain areas.

Following formation of the LDD areas 28 and S/D areas 30, an anneal may be performed. Thermal radiation 32 may be used to anneal semiconductor substrate 10 and metal layer 12, as shown in FIG. 9, to form silicide layer 34 upon the source and drain regions 30 and activate the S/D implants. Annealing preferably occurs in a rapid thermal processing chamber at temperatures between about 600° and about 950° C. for about 5–60 seconds. Annealing may also occur in a tube furnace for about 5–30 minutes at a temperature of about 650°–850° C. The annealing ambient is preferably an inert ambient, which may contain nitrogen, helium, and/or argon. According to a preferred embodiment, metal layer 12 is not exposed to elevated temperatures prior to the annealing, such that no silicide is formed until after the LDD and S/D areas are formed.

Figure 10:
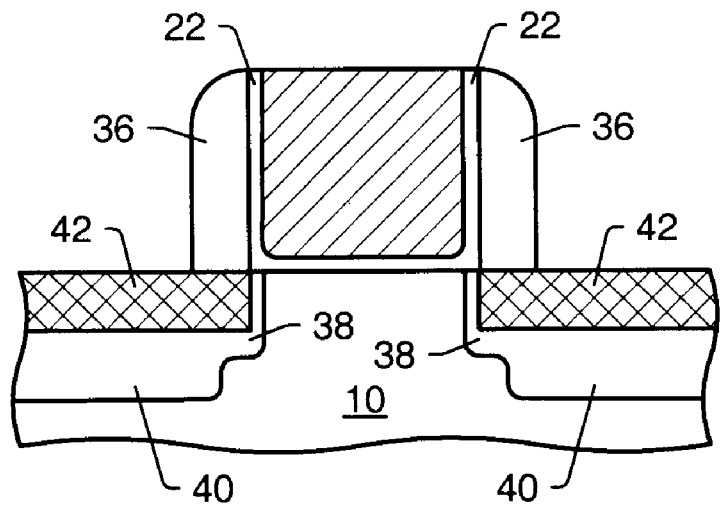
FIG. 10 depicts a partial cross-sectional view of the semiconductor topography according to an alternative embodiment, wherein spacers are formed adjacent vertically extending portions of the dielectric layer and wherein the source and drain areas are formed simultaneously with the lightly doped drain areas and self-aligned to the spacers.

As described above, vertically oriented dielectric portions 22 may have a width of about 50 angstroms or less. In some instances, it may be considered desirable to space source and drain regions farther from the gate conductor than the width of dielectric portions 22 (e.g., to reduce short channel effects such as hot carrier injection). As such, spacers formed adjacent dielectric portions 22 may be used to space the source and drain impurity areas farther from the channel. For example, a dielectric material may be deposited across gate conductor 24 and semiconductor substrate 10 and preferentially removed from substantially horizontal surfaces while being retained adjacent substantially vertical surfaces. The dielectric material may include various materials such as oxide, nitride, or oxynitride. As shown in FIG. 10, spacers 36 have been formed adjacent dielectric portions 22. LDD impurity areas 38 and S/D impurity areas 40 may be formed within semiconductor substrate 10 following formation of additional spacers 36 by use of a single implant similar to implant 26 (FIG. 8). Following formation of the S/D areas 40, the device may be annealed as previously described to form silicide 42 as shown.

Figure 11:
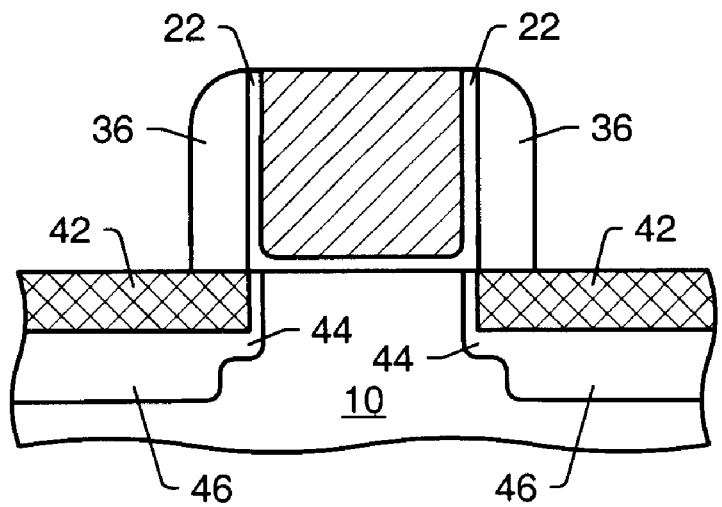
FIG. 11 depicts a partial cross-sectional view of the semiconductor topography according to a further alternative embodiment, wherein spacers are formed adjacent the vertically extending dielectric portions and wherein the source and drain areas are formed following the lightly doped drain areas and self-aligned to the spacers.

Alternatively, LDD impurity areas 44 may be formed prior to formation of spacers 36 by, e.g., implanting first impurity ions at a first energy and a first concentration into semiconductor substrate 10 self-aligned with sidewall surfaces of vertically extending dielectric portions 22. For example, the first impurity ions may be implanted at a concentration of between about $8.0 \times 10^{14}$ and $3.0 \times 10^{15}$ $cm^{-2}$ and an energy of between about 0.5 and 5 keV. Spacers 36 may then be formed as previously described and second impurity ions implanted into semiconductor substrate 10 self-aligned with sidewalls of spacers 36 at a second energy greater than the first energy and a second concentration greater than the first concentration to form S/D areas 46, as is shown in FIG. 11. For example, the second implant may be at a concentration of between about $2.0 \times 10^{15}$ and $9.0 \times 10^{15}$ $cm^{-2}$ and an energy between about 1 and 10 keV. Following formation of the S/D areas 46, the device may be annealed as previously described to form silicide 42 as shown. In either of the above embodiments, spacers 36 may be removed after formation of the S/D areas.

Figure 12:
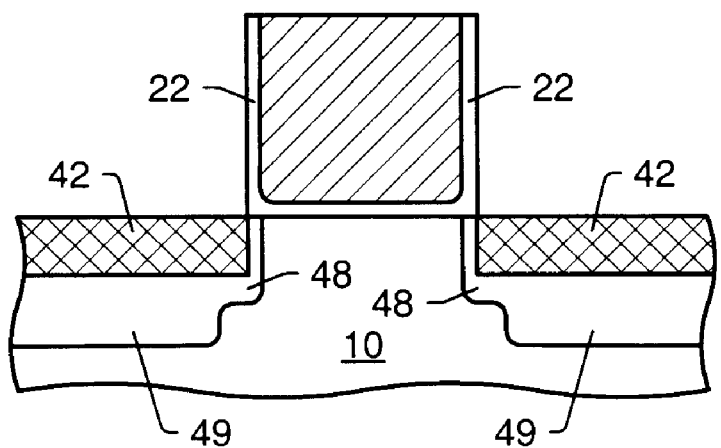
FIG. 12 depicts a partial cross-sectional view of the semiconductor topography according to yet another alternative embodiment, wherein spacers are formed adjacent the vertically extending dielectric portions, the source and drain areas are formed self-aligned to the spacers, the spacers are removed, and the lightly doped drain areas are formed after the spacer removal.

In a further alternative embodiment, spacers 36 may be formed adjacent vertically extending dielectric portions 22 and S/D areas 49 formed by e.g., implanting ions at a first concentration and a first energy into semiconductor substrate 10. Spacers 36 may then be removed and LDD areas 48 formed by, e.g., implanting ions at a second concentration and a second energy into semiconductor substrate 10. The concentrations and energies may be similar to those described in the preceding embodiment. The device may then be annealed as previously described to form silicide 42 (FIG. 12).

Figure 13:
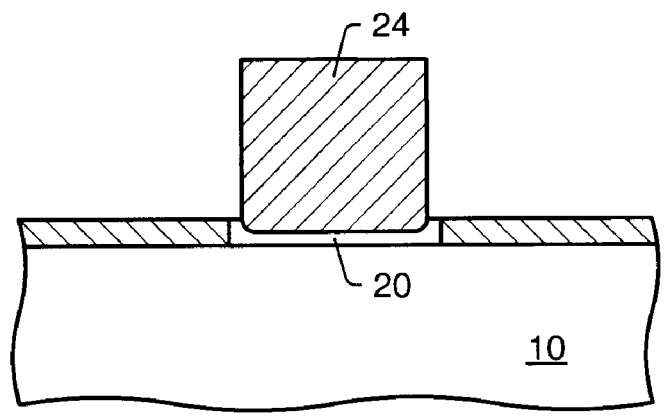
FIG. 13 depicts a partial cross-sectional view of the semiconductor topography according to an alternate embodiment, wherein the masking structures and the vertically extending dielectric portions are removed.

According to an alternative embodiment, shown in FIGS. 13–16, masking structures 14 and gate dielectric layer 16 may include materials having substantially similar etch characteristics. For example, both the masking structures and the gate dielectric layer may include oxide. In such an embodiment, removal of masking structures 14 may result in the simultaneous removal of vertically extending dielectric portions 22. After polishing the gate conductor (FIG. 6), masking structures 14 and dielectric portions 22 may be removed using, e.g., a wet etch, as shown in FIG. 13, leaving gate conductor 24 and gate dielectric 20 upon semiconductor substrate 10. Spacers 50, shown in FIG. 14, may be formed adjacent sidewall surfaces of gate conductor 24 by deposition and selective removal of a conformal dielectric, as described previously with reference to FIG. 10.

Figure 14:
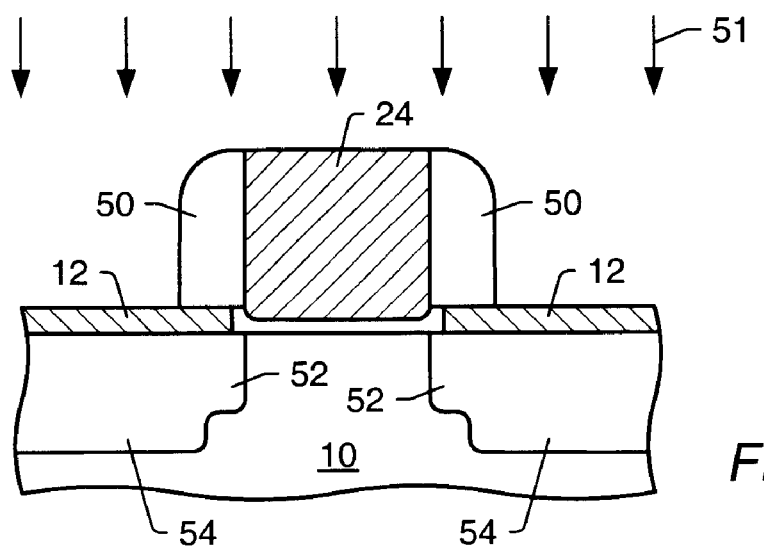
FIG. 14 depicts a partial cross-sectional view of the semiconductor topography wherein spacers are formed adjacent the gate conductor and source and drain areas and lightly doped drain areas are formed in the semiconductor substrate.
Figure 15:
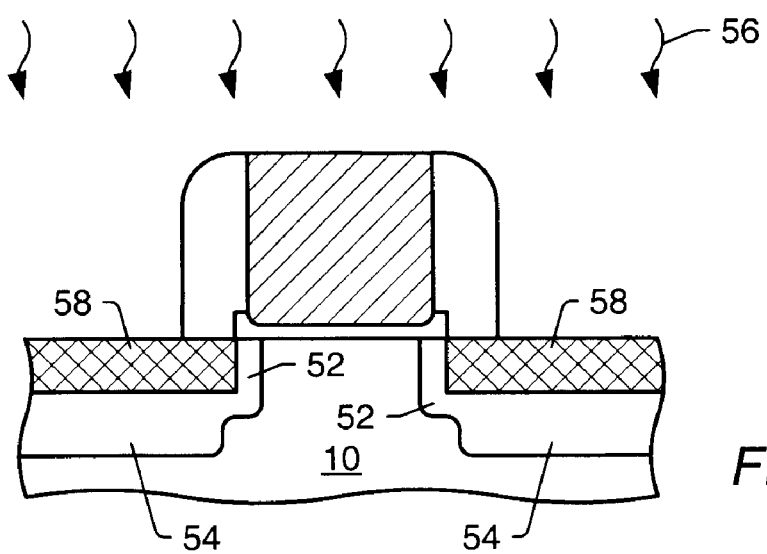
FIG. 15 depicts a partial cross-sectional view of the semiconductor topography wherein an anneal is performed to form a metal silicide upon the source and drain areas.
Figure 16:
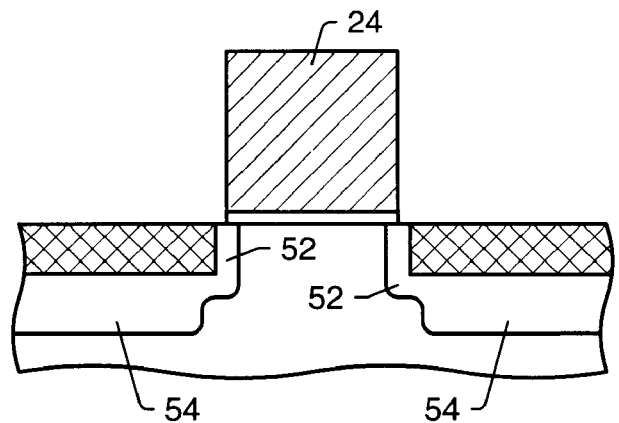
FIG. 16 depicts a partial cross-sectional view of the semiconductor topography wherein the spacers have been removed following formation of the source and drain areas.

In an embodiment shown in FIG. 14, impurity implant 51 has been used to form LDD impurity areas 52 in semiconductor substrate 10 self-aligned with sidewall surfaces of gate conductor 24 in areas of the substrate underlying the spacers 50. Source and drain impurity areas 54 have been simultaneously formed self-aligned with sidewalls of spacers 50. As shown in FIG. 15, exposure to radiation 56 may then be used to react metal 12 with substrate 10 to form silicide 58 upon upper surfaces of the substrate and activate implants, as described previously for FIG. 8. Alternatively, LDD areas 52 may be formed prior to formation of spacers 50 by e.g., ion implantation. S/D areas 54 may be formed using a separate implant following spacer formation. Spacers 50 may be removed from adjacent gate conductor 24 following formation of S/D areas 54 in either of the above-described embodiments. In an alternative embodiment, spacers 50 may be formed prior to formation of the impurity areas. S/D areas 54 may be formed with sidewall surfaces of spacers 50, followed by removal of the spacers and formation of LDD areas 52 self-aligned with sidewall surfaces of the gate conductor 24, as shown in FIG. 16.

A further alternative embodiment of the present process is depicted in FIGS. 17–22. Following formation of masking structures 14 and selective removal of portions of metal 12 (FIG. 3), a gate dielectric 60 may be grown upon exposed upper surfaces of semiconductor substrate 10, as shown in FIG. 17a. Gate dielectric 60 may include silicon dioxide thermally grown in an oxidizing ambient. Alternatively, gate dielectric 60 may include silicon nitride or nitrided silicon dioxide grown in an ambient including $N_2O$ and $NH_3$, NO and $NH_3$, or a combination of NO, $N_2O$, and $NH_3$. Dielectric 60 may be grown rather than deposited in order to obtain favorable dielectric properties and/or to closely control the thickness of the gate dielectric. Conductive material 62 may then be deposited across gate dielectric 60 and masking structures 14. Conductive material 62 may include a metal, a metal compound, or polysilicon as previously described.

Figure 17A:
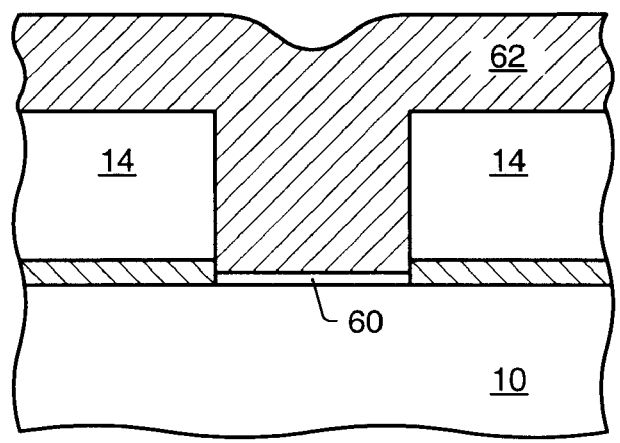
FIG. 17a depicts a partial cross-sectional view of the semiconductor topography according to an alternative embodiment, wherein a gate dielectric has been grown upon the semiconductor substrate and wherein a conductive material has been deposited across the masking structures and the gate dielectric.
Figure 17B:
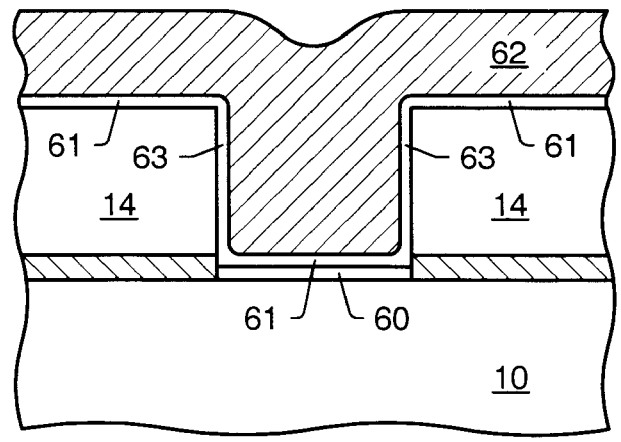
FIG. 17b depicts a partial cross-sectional view of the semiconductor topography according to an alternative embodiment, wherein a gate dielectric has been grown upon the semiconductor substrate, a spacer dielectric has been deposited across the masking structures and the gate dielectric, and a conductive material has been deposited across the masking structures, the spacer dielectric and the gate dielectric.

To ensure that contact between metal layer 12 and the subsequently formed gate conductor is prevented, an optional spacer layer 61 may be required adjacent the sidewalls of the masking structures. As shown in FIG. 17b, vertically extending dielectric portions 63 may be formed adjacent sidewalls of masking structures 14 by, e.g., deposition of a conformal dielectric material such as silicon dioxide or silicon nitride. Conductive material 62 may then be deposited across gate dielectric 60, dielectric 61, and masking structures 14. In an embodiment in which dielectric 61 may be etched selectively to dielectric 60, an anisotropic etch may be used to remove portions of dielectric 61 from upon dielectric 60 while retaining vertically extending portions 63 adjacent the sidewalls of the masking structures. For clarity, dielectric portions 61 and/or 63 are not shown in subsequent figures, although in an embodiment dielectric portions 61/63 may be present.

Figure 18:
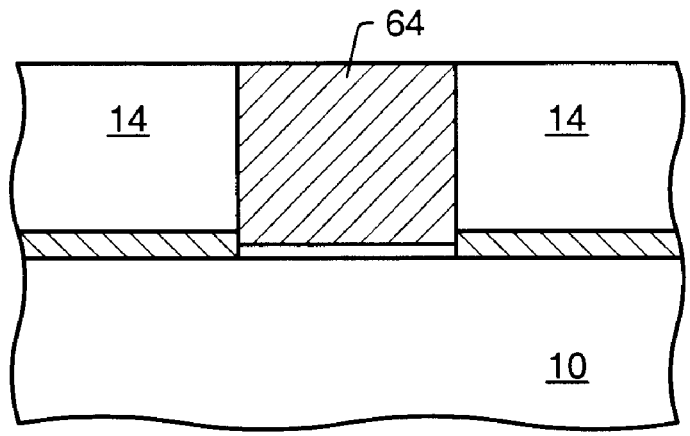
FIG. 18 depicts a partial cross-sectional view of the semiconductor topography wherein the conductive material is planarized commensurate with an upper surface of the masking structures.
Figure 19:
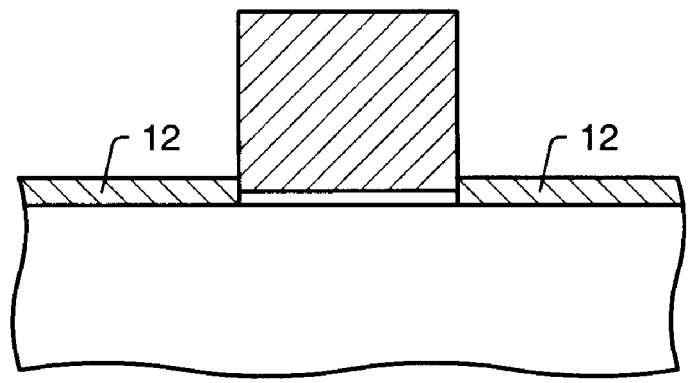
FIG. 19 depicts a partial cross-sectional view of the semiconductor topography wherein the masking structures have been removed.
Figure 20:
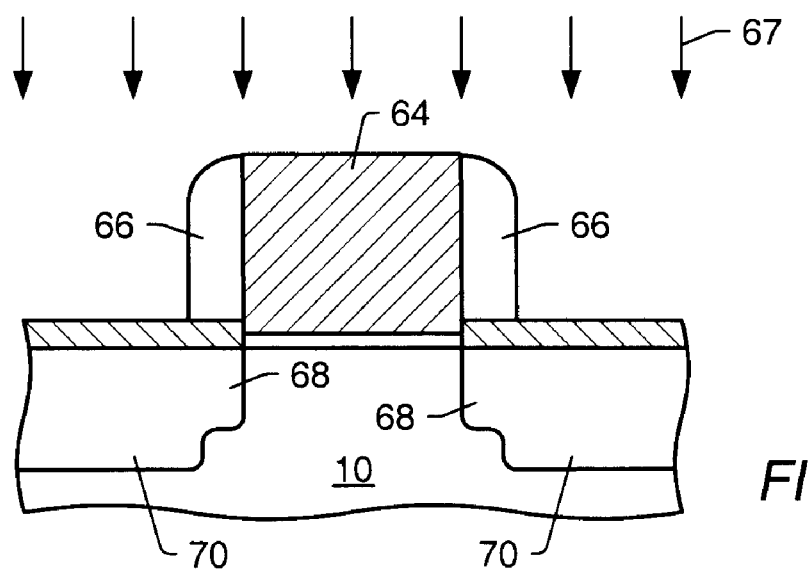
FIG. 20 depicts a partial cross-sectional view of the semiconductor topography wherein spacers have been formed adjacent the gate conductor and wherein source and drain areas have been formed self-aligned with the spacers and lightly doped drain areas have been formed adjacent the gate.

Potions of conductive material 62 (and dielectric 61, if present) may be removed using, e.g., chemical-mechanical polish as described for FIG. 6. Preferably, conductive material 62 is removed at least to a level commensurate with upper surfaces of masking structures 14, as shown in FIG. 18. The remaining conductive material forms gate conductor 64. According to this embodiment, masking structures 14 may be selectively removed from upon metal layer 12, as shown in FIG. 19. Masking structures 14 may be removed using, e.g., a wet etch selective for the masking material, as described previously for FIGS. 6 and 13. Spacers 66 may be formed adjacent sidewall surfaces of gate conductor 64 (or dielectric portions 63, if formed and not removed with the masking structures), as shown in FIG. 20, by deposition and selective removal of a conformal dielectric, as described previously for FIGS. 9 and 13. Impurity implant 67 may be used to form LDD impurity areas 68 in substrate 10 self-aligned with sidewall surfaces of gate conductor 64 and S/D areas 70 may be simultaneously formed self-aligned with sidewalls of spacers 66.

Figure 21:
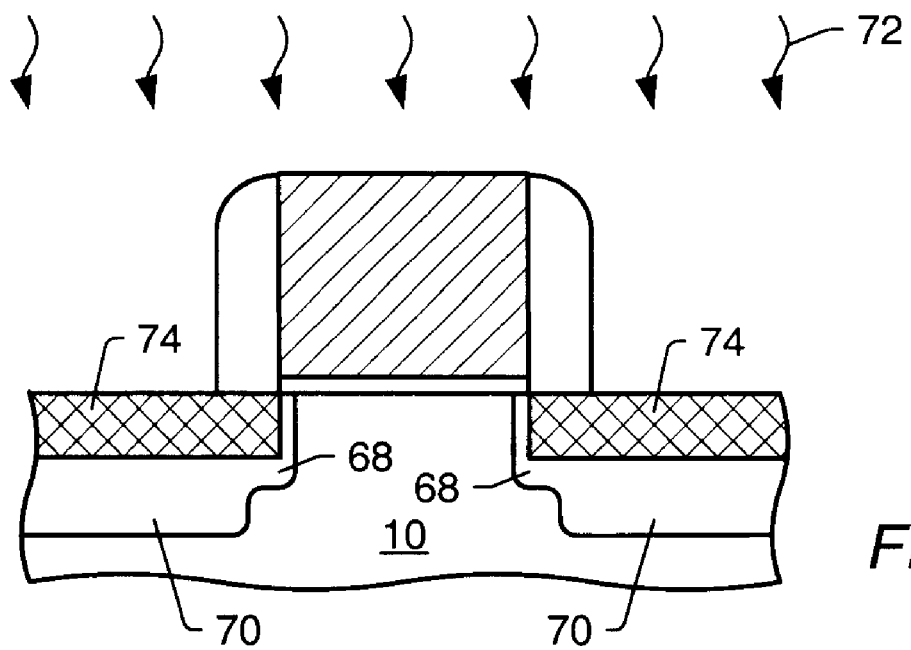
FIG. 21 depicts a partial cross-sectional view of the semiconductor topography wherein an anneal is performed to form a metal silicide upon the source and drain areas.
Figure 22:
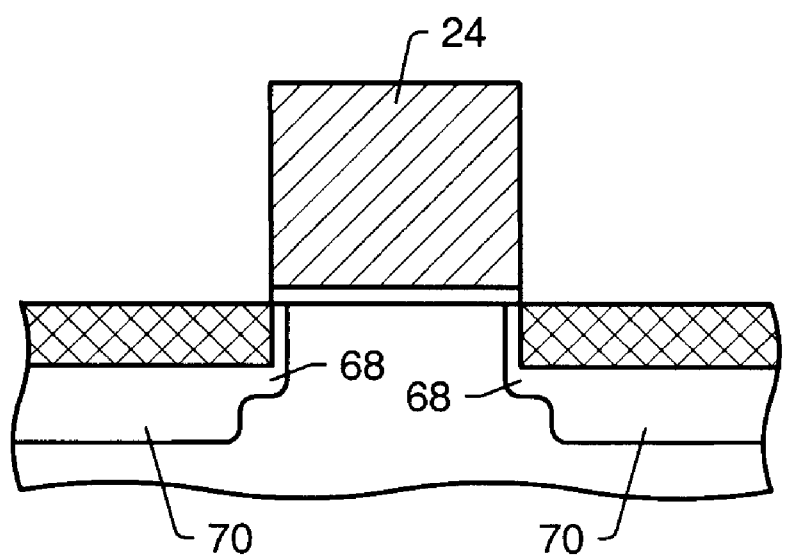
FIG. 22 depicts a partial cross-sectional view of the semiconductor topography, wherein the spacers have been removed following formation of the source and drain areas.

Turning now to FIG. 21, exposure to thermal radiation 72 may then be used to react metal 12 with substrate 10 to form silicide 74 upon upper surfaces of the substrate, as described previously for FIGS. 9 and 15. Alternatively, LDD areas 68 may be formed by, e.g., ion implantation, prior to forming spacers 66. S/D areas 70 may be formed using a separate implant following spacer formation. Spacers 66 may be removed from adjacent gate conductor 24 following formation of S/D areas 70 in either of the above-described embodiments. In an alternative embodiment, spacers 66 may be formed prior to formation of the impurity areas. S/D areas 70 may be formed aligned with sidewall surfaces of spacers 66, followed by removal of the spacers and formation of LDD areas 68 self-aligned with sidewall surfaces of the gate conductor 24 (FIG. 22). Other LDD processes may also be employed.

It will be appreciated to those skilled in the art having the benefit of this disclosure that this invention is believed to provide a method for forming a transistor having metal silicide areas in close proximity to the gate conductor. It will be further appreciated to those skilled in the art having the benefit of this disclosure that this invention is believed to provide a method for forming a transistor having a metal gate conductor and particularly a metal gate conductor self-aligned with source-drain and/or lightly doped drain impurity areas. Further modifications and alternative embodiments of various aspects of the invention will be apparent to those skilled in the art in view of this description. It is intended that the following claims be interpreted to embrace all such modifications and changes and, accordingly, the specification and drawings are to be regarded in an illustrative rather than a restrictive sense.

What is claimed is:

1. An integrated circuit, comprising:
   a gate conductor spaced above a semiconductor substrate by a gate dielectric;
   lightly doped drain impurity areas within said semiconductor substrate and aligned with sidewall surfaces of said gate conductor;
   dielectric portions extending vertically from said gate dielectric and laterally adjacent said sidewall surfaces of said gate conductor, wherein the entire upper surfaces of said vertically extending dielectric portions are substantially coplanar with an upper surface of said gate conductor;

a metal silicide upon said semiconductor substrate and aligned with sidewall surfaces of said vertically extending dielectric portions; and source and drain impurity areas within said semiconductor substrate aligned a spaced distance from said gate conductor sidewall surfaces.

2. The integrated circuit as recited in claim 1 wherein said spaced distance is substantially equal to a thickness of said vertically extending dielectric portions.

3. The integrated circuit as recited in claim 1 wherein said gate conductor comprises a metal.

4. The integrated circuit as recited in claim 1 wherein a thickness of said vertically extending dielectric portions is substantially between about 15 angstroms and about 50 angstroms.

5. The integrated circuit as recited in claim 1, further comprising spacers formed laterally adjacent sidewall surfaces of said vertically extending dielectric portions, and wherein said spaced distance is substantially equal to a combined thickness of said vertically extending dielectric portions and said spacers.

6. The integrated circuit as recited in claim 1, further comprising spacers formed laterally adjacent sidewall surfaces of said vertically extending dielectric portions, and wherein said spaced distance is substantially equal to a thickness of said spacers.

7. An integrated circuit comprising:

a gate conductor spaced above a semiconductor substrate by a gate dielectric;

lightly doped drain impurity areas within said semiconductor substrate and aligned with sidewall surfaces of said gate conductor;

a metal silicide upon said semiconductor substrate a first spaced distance from said gate conductor sidewall surfaces;

spacers arranged upon vertically extending portions from said gate dielectric and upon said metal silicide and laterally adjacent said sidewall surfaces of said gate conductor; and source and drain impurity areas within said semiconductor substrate aligned a second spaced distance from said gate conductor sidewall surfaces, wherein said second spaced distance is substantially equal to a thickness of said spacers.

8. The integrated circuit as recited in claim 7 wherein said first spaced distance is substantially equal to a thickness of said vertically extending portions of said gate dielectric.

9. The integrated circuit as recited in claim 7 wherein said gate conductor comprises a metal.

10. An integrated circuit comprising:

a gate conductor spaced above a semiconductor substrate by a gate dielectric;

lightly doped drain impurity areas within said semiconductor substrate and aligned with sidewall surfaces of said gate conductor;

a metal silicide upon said semiconductor substrate aligned with said gate conductor sidewall surfaces; and source and drain impurity areas within said semiconductor substrate aligned a spaced distance from said gate conductor sidewall surfaces.

11. The integrated circuit as recited in claim 10, further comprising spacers arranged laterally adjacent said gate conductor sidewall surfaces and upon said metal silicide, and wherein said spaced distance is substantially equal to a thickness of said spacers.

12. An integrated circuit comprising:

a gate conductor spaced above a semiconductor substrate by a gate dielectric;

dielectric portions extending vertically from said gate dielectric and laterally adjacent said sidewall surfaces of said gate conductor, wherein said dielectric portions have a lateral thickness less than or equal to a vertical thickness of said gate dielectric;

a metal silicide upon said semiconductor substrate and aligned with sidewall surfaces of said vertically extending dielectric portions; and source and drain impurity areas within said semiconductor substrate on opposite sides of said gate conductor.

13. An integrated circuit comprising:

a gate conductor spaced above a semiconductor substrate by a gate dielectric;

a metal silicide upon said semiconductor substrate a first spaced distance from said gate conductor sidewall surfaces; and source and drain impurity areas within said semiconductor substrate aligned a second spaced distance from said gate conductor sidewall surfaces;

wherein said first spaced distance is less than said second spaced distance.

14. An integrated circuit, comprising:

a gate conductor spaced above a semiconductor substrate by a gate dielectric;

lightly doped drain impurity areas within said semiconductor substrate and aligned with sidewall surfaces of said gate conductor;

dielectric portions extending vertically from said gate dielectric and laterally adjacent said sidewall surfaces of said gate conductor, wherein upper surfaces of said vertically extending dielectric portions are substantially coplanar with an upper surface of said gate conductor, and wherein said gate dielectric and said dielectric portions are a single contiguous layer of oxide:

a metal silicide upon said semiconductor substrate and aligned with sidewall surfaces of said vertically extending dielectric portions; and source and drain impurity areas within said semiconductor substrate aligned a spaced distance from said gate conductor sidewall surfaces.

* * * * *